United States Patent [19]

Okazaki et al.

[11] Patent Number: 4,977,076

[45] Date of Patent: Dec. 11, 1990

[54] PRESENSITIZED PLATE FOR LITHOGRAPHY

[75] Inventors: Masaki Okazaki; Kiyohiko Yamamuro, both of Kanagawa; Shigeo Koizumi; Keisuke Shiba, both of Shizuoka, all of Japan

[73] Assignee: Fuji Photo Film Co., Ltd., Minami-ashigara, Japan

[21] Appl. No.: 273,748

[22] Filed: Nov. 16, 1988

Related U.S. Application Data

[63] Continuation of Ser. No. 910,674, Sep. 23, 1986, abandoned.

[30] Foreign Application Priority Data

Sep. 30, 1985 [JP] Japan ................................ 60-217411

[51] Int. Cl.$^5$ ........................... G03C 1/12; G03C 1/16
[52] U.S. Cl. ................................... 430/583; 430/302; 430/591; 430/592; 430/945
[58] Field of Search ............... 430/302, 591, 592, 583, 430/570, 945

[56] References Cited

U.S. PATENT DOCUMENTS

| | | | |
|---|---|---|---|
| 4,160,669 | 7/1979 | Habu et al. | 430/591 |
| 4,299,912 | 11/1981 | Shiba et al. | 430/302 |
| 4,332,889 | 6/1982 | Siga et al. | 430/583 |
| 4,469,785 | 9/1984 | Tanaka et al. | 430/570 |
| 4,581,329 | 4/1986 | Sugimoto et al. | 430/591 |

*Primary Examiner*—Paul R. Michl
*Assistant Examiner*—Mark R. Buscher
*Attorney, Agent, or Firm*—Burns, Doane, Swecker & Mathis

[57] ABSTRACT

A presensitized plate from which a lithographic printing plate is to be prepared, comprising a support having provided thereon a non-silver light-sensitive layer comprising an O-quinonediazide compound and a silver halide light-sensitive layer in this order, said silver halide light-sensitive layer containing a specific sensitizing dye. The presensitized plate is specifically high in sensitivity to a light of the wavelength in the range of 480 nm to 520 nm, and therefore it can be handled even under the lighter safe light.

7 Claims, No Drawings

PRESENSITIZED PLATE FOR LITHOGRAPHY

This application is a continuation of application Ser. No. 910,674, filed Sept. 23, 1986 now abandoned.

BACKGROUND OF THE INVENTION (1) Field of the Invention

The present invention relates to a presensitized plate from which a lithographic printing plate is to be prepared, and particularly to such plate having a silver halide light-sensitive layer which is to be exposed to argon-ion laser beam for the preparation of the printing plate, and which is high in sensitivity and can be handled under a safe light.

(2) Prior Art

There is known a process for preparing printing plates, including the step of exposure of a presensitized plate to a laser beam so as to produce an image on the plate, in which argon-ion laser beam is usually used. As a suitable presensitized plate for such process, there has been used a silver halide photographic film. However, in preparing a printing plate for lithography, a presensitized plate having a silver halide light-sensitive layer has a drawback in that it is less sensitive to a low-energy argon-ion laser beam while enhancement in the sensitivity will result in difficulty in handling the plate under a conventional safe light.

SUMMARY OF THE INVENTION

A primary object of the present invention is therefore to provide a novel presensitized plate for lithography, which is high in sensitivity to the argon-ion laser beam and can be handled under the safe light. More particularly, an object of the present invention is to provide a presensitized plate for use in preparing a lithographic printing plate, which is specifically sensitive to the light of a wavelength in the range of 480 nm to 520 nm, particularly 488 nm or 514 nm beam of an argon-ion laser, but less sensitive to the light of the other wavelength region, particularly to those having a wavelength longer than 540 nm.

The present inventors have found that the objects can be achieved through the use of specific types of sensitizing dyes.

Thus, according to the present invention there is provided a presensitized plate comprising a support having provided thereon a silver halide light-sensitive layer, from which a lithographic printing plate is to be prepared, said light-sensitive layer containing at least one sensitizing dye selected from the compounds represented by the following formula (I), (II), (III) or (IV).

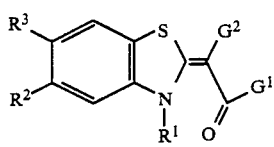
(I)

in which $G^1$ denotes a substituted or unsubstituted alkyl group, an alkoxy group, an aryloxy group, hydroxy group, or a substituted or unsubstituted amino group; $G^2$ denotes a group expressed by $G^1$, cyano group, an alkyl group, an arylsulfonyl group, or

and $G^1$ and $G^2$ may form a five-membered or six-membered heterocyclic ring. Preferably, $G^1$ and $G^2$ form a rhodanine nucleus having a substituent at the 3-position, or a 2-thiohydantoin nucleus having substituents at the 1- and 3-position, in the formula (I), $R^1$ denotes hydrogen atom, a substituted or unsubstituted alkyl group, while $R^2$ and $R^3$ independently denote a substituted or unsubstituted alkyl group, or an alkoxy group and may form an aromatic ring condensed with a benzothiazole nucleus. In a case where one of $R^2$ and $R^3$ is hydrogen atom, the other denotes a functional group as defined above other than hydrogen atom.

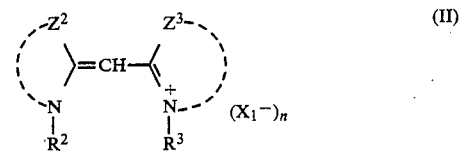
(II)

in which $Z^2$ and $Z^3$ are the same or different and each denotes a non-metallic atomic group necessary for forming a five-membered or six-membered heterocyclic ring. Preferably, $Z^2$ and $Z^3$ each denotes a non-metallic atomic group necessary for forming a substituted or unsubstituted benzoselenazole, benzothiazole, naphthothiazole, or naphthooxazole. In the formula (II), each of $R^2$ and $R^3$ has the same definition as $R^1$ in the formula (I). $X_1^-$ denotes an anion with n being an integer of 0 or 1 in which n is zero in the case of the formation of an intramolecular salt.

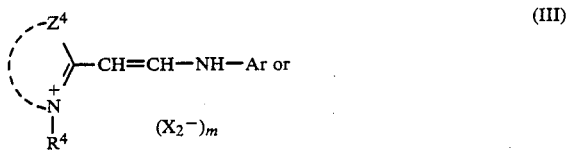
(III)

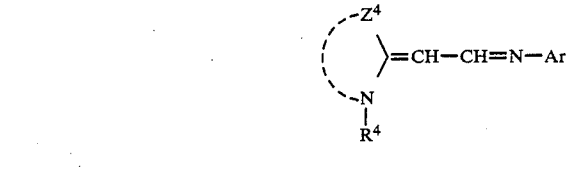

in which $Z^4$ denotes a non-metallic atomic group necessary for forming a five-membered or six-membered heterocyclic ring, preferably a substituted or unsubstituted naphthothiazole or naphthoselenazole. In the formula (III), Ar denotes a substituted or unsubstituted monovalent aromatic residue, while $R^4$ has the same definition as $R^1$ in the formula (I). $X_2^-$ denotes an anion with m being an integer of 0 or 1 in which m is zero in the case of the formation of an intramolecular salt.

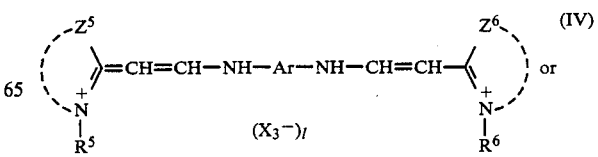
(IV)

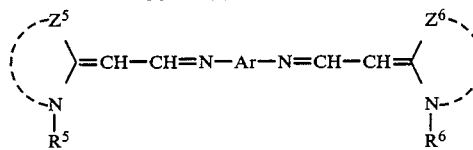

in which $Z^5$ and $Z_6$ are the same or different and each denotes a non-metallic group necessary for forming a five-membered or six-membered heterocyclic ring, and preferably each of $Z^5$ and $Z^6$ denotes a non-metallic atomic group necessary for forming a substituted or unsubstituted thiazoline, thiazole or benzothiazole. In the formula (IV), each of $R^5$ and $R^6$ has the same definition as $R^1$ in (I). $X_3{}^-$ denotes an anion with l being an integer of 0 or 1 in in which l is zero in the case of the formation of an intramolecular salt. Specific examples which can be used in the invention are illustrated as follows:

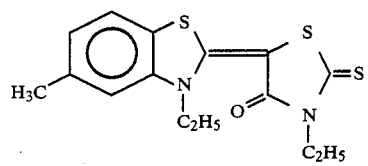

1

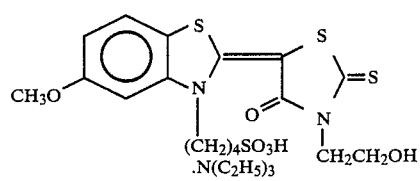

2

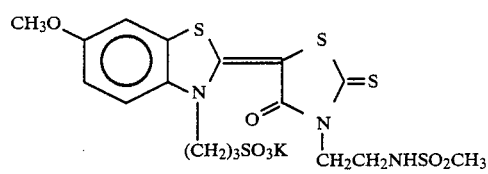

3

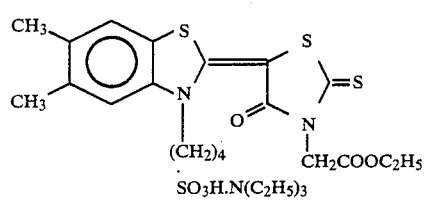

4

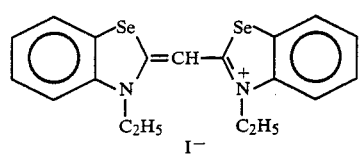

7

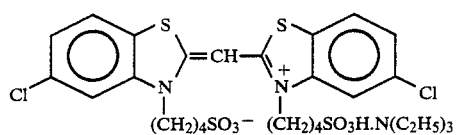

8

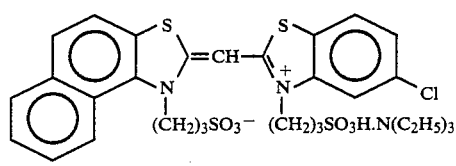

9

-continued
10
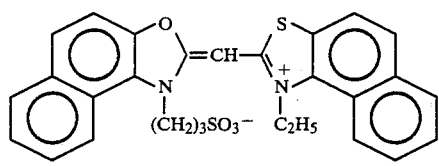
11
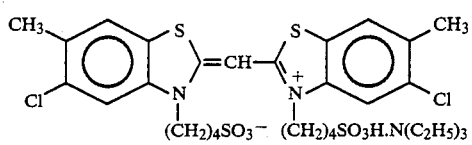
12
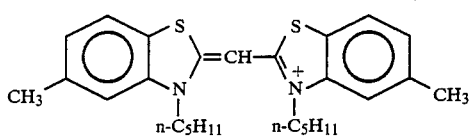
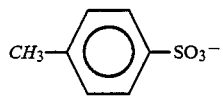
13
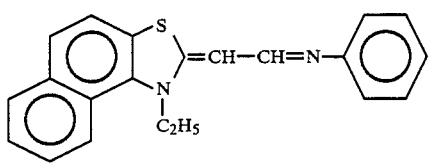
14
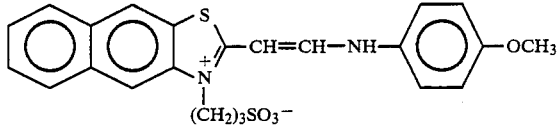
15
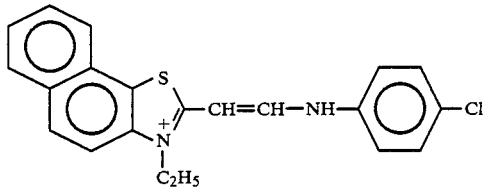
16
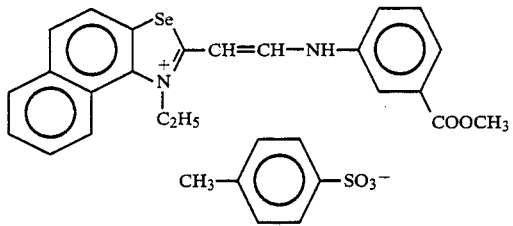
17
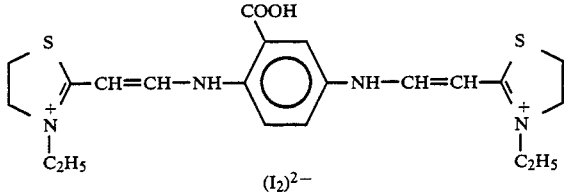

-continued

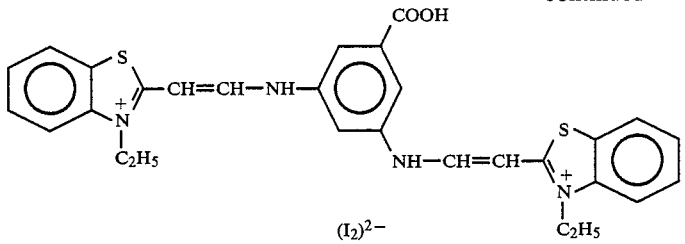

18

DETAILED DESCRIPTION OF THE INVENTION

The compounds which can be used in the present invention as sensitizing dyes, which are represented by the formula (I), (II), (III) or (IV), can be easily prepared in such a manner as described in F. M. Hamer "Heterocyclic compounds—Cyanine dyes and related compounds" John Wiley & Sons Co. (New York, London), 1964; or D. M. Sturmer "Heterocyclic Compounds - Special topics in heterocyclic chemistry" Chapter VIII, Sec. IV, pages 482–515, John Wiley & Sons Co. (New York, London), 1977. Typical examples of the preparations of some of these compounds will be described below.

SYNTHESIS EXAMPLE 1, Synthesis of Compound 2

To a mixture of 4-[5-methoxy-2-(4-sulfobutylthio)-3-benzothiazolio] butanesulfonate 69.15 g ($1.50 \times 10^{-1}$ M), 3-(2-hydroxyethyl) rhodanine 39.75 g ($2.24 \times 10^{-1}$ M), ethanol 1350 ml and distilled water 150 ml, there was added dropwise 45.15 g ($4.47 \times 10^{-1}$ M) of triethylamine, while stirring at room temperature. After the mixture was stirred for about one hour at room temperature, the precipitated crystalline product was filtrated out, which was them washed with 300 ml of ethanol. To the crystalline product thus obtained were added 1134 ml of ethanol, 126 ml of distilled water, 7.0 ml of triethylamine, 3.15 g of activated charcoal. The mixture was heated for obtaining a solution which was then subjected to a natural filtration. Cooling of the filtrate with ice while stirring produced a crystalline compound which was filtrated out and washed with 200 ml of ethanol to obtain the desired dye (yield: 67.6%, melting point: 178°–180° C.).

SYNTHETIC EXAMPLE 2, Synthesis of Compound 17

A mixture of 2-(2-N-acetylanilinovinyl)-3-ethylthiazoliniumiodide 8.0 g ($1.99 \times 10^{-2}$ M) and 2,5-diaminobenzoic acid 3.8 g ($2.43 \times 10^{-2}$ M) was dispersed in 200 ml of pyridine. The mixture was heated to 85° C. while stirring in a water bath. About ten minutes after the start of the stirring, the contents was dissolved and sixty minute later there was observed the precipitation of a crystalline product. After further heating for about two hours and cooling with ice, the precipitated crystalline product was filtrated out, which product was then washed with 100 ml of iso-propanol. The crystalline product thus obtained was dissolved in a mixture of methanol 150 ml and chloroform 150 ml under heating. To the solution, is added activated charcoal. The mixture was refluxed for thirty minutes, followed by a natural filtration. The filtrate was added with 100 ml of isopropanol. The mixture thus obtained was subjected to a distillation under ordinary pressure to remove about 250 ml of the solvent. The mixture was then allowed to stand at room temperature to precipitate a crystalline product. The crystalline product was filtrated out and washed with 50 ml of iso-propanol to obtain 3.0 g of the desired dye (yield: 44.0%, melting point: 205°–210° C.).

SYNTHETIC EXAMPLE 3, Synthesis of Compound 8

A mixture of 4-[5-chloro-2-(sulfobutylthio)-3-benzothiazolio] butanesulfonate 17.5 g ($3.60 \times 10^{-2}$ M), 4-(5-chloro-2-methyl-3-benzothiazolio) butanesulfonate 9.6 g ($3.00 \times 10^{-2}$ M), acetonitrile 80 ml and distilled water 25 ml was heated to 60° C. with stirring in a water bath. To the mixture was added 15 ml ($1.07 \times 10^{-1}$ M) of triethylamine and the resultant was stirred for about forty minutes. There was then added 100 ml of acetonitrile to precipitate a crystalline product, followed by cooling with water down to 20° C. The crystalline product was filtered and washed with 100 ml of acetonitrile. The crystalline product thus obtained was dissolved in a mixture of 150 ml of methanol and 3 ml of triethylamine under heating and the resultant solutoin was subjected to natural filtration. The filtrate was added with 90 ml of acetonitrile. The mixture obtained was subjected to a distillation under ordinary pressure to distil out the solvent (100 ml). The mixture was then allowed to stand at room temperature to precipitate a crystalline product. The crystalline product was filtrated out and washed with 200 ml of acetonitrile to obtain 18.0 g of the desired sensitizing dye (yield: 84.1%, melting point 302° C.).

Silver halide particles which can be used in the present invention may be of the types of the surface latent image or of the internal latent image. The silver halide particles may be prepared in a conventional manner, for example, by the ammoniacal process, the neutralization process, the acid process, the single jet process, the double jet process or the controlled double jet process, as described in Grafikides "Chimie Photographique" Paul Montel Pub. Co., 1957. Protective colloid is usually used in an amount of about 10 g to 200 g per kg of a silver halide emulsion. The emulsion may contain a small quantity of a highly active film-hardener such as an active vinyl compound (e.g. divinylsulfon or methylenebismaleimide) or active halogenated compound (e.g. 2,4-dichloro-6-hydroxy-S-triazine). There may also be employed other additives, for example, a stabilizer, an antifoggant, coating aids (such as a surfactant), or pigments or dyes. If necessary, there may be dispersed, in the silver halide emulsion layer, such a compound as hydroquinone, a hydroquinone derivative, catechol, a catechol derivative, pyrogallol or a pyrogallol derivative. A resinous material such as a phenolic resin may be incorporated in the silver halide emulsion layer.

The silver halide particles may be chemically sensitized by, for example, the sulfur-sensitization or the reduction-sensitization or by the noble metal salt sensitization such as Ir, Rh, Pt or Au, so as to exhibit a proper sensitivity, and then spectrally sensitized by the incorporation of a sensitizing dye so as to have the maximum spectral sensitivity at a wavelength in the range of 480 nm to 520 nm, in which the sensitizing dye is preferably used in an amount of $5 \times 10^{-5}$ moles to $5 \times 10^{-3}$ moles per mole of the silver halide.

The silver halide emulsion suitable for use in the present invention may be exemplified by silver bromide, silver chloride, silver iode or a combination thereof, which is dispersed in a hydrophilic protective colloid such as gelatin, gelatin derivative, casein, sodium alginate, a cellulose derivative, polyvinyl alcohol having acetol groups therein, polyvinyl pyrollidone, polyacryl amide, polyvinyl imidazole or polyvinyl pyrazole, including copolymers thereof, as described in U.S. Pat. Nos. 2,594,293; 2,614,928; 2,763,639; 2,831,767; 3,118,766; and 3,186,846; or Japanese Patent Publication Nos. 5514/64 and 26845/67. A preferable emulsion is the one obtained by dispersing particles of combined silver halides, having an average diameter in the range of $0.01\mu$ to $2\mu$, in a protective colloide including at least gelatin or a gelatin derivative.

A flexible support for the presensitized plate according to the present invention is of various materials, and particularly of sheet materials which have a excellent dimension stability and a hydrophilic surface. Examples of suitable supports are detailed in U.S. Pat. No. 4,268,609, column 2, line 61 to colume 3 line 56. Of these, aluminum plate is most preferable. Such aluminum plate is preferably subjected to a surface treatment, such as graining, immersion in an aqueous solution of sodium silicate, potassium fluoro zirconate, a phosphate or the like, or anodization. An aluminum plate which have undergone two or more of such treatments may also be suitably used in the present invention. For example, suitable is an aluminum plate as described in U.S. Pat. No. 2,714,066 in which the aluminum plate is obtained by sand-graining, followed by a dipping treatment in an aqueous solution of sodium silicate, or an aluminum plate as described in U.S. Pat. No. 3,181,461 in which the aluminum plate is obtained by an anodization treatment and then an immersion treatment in an aqueous solution of an alkali metal silicate. The anodization treatment is usually carried out by passing electricity through an aluminum plate in an aqueous or nonaqueous solution containing an inorganic acid such as phosphoric acid, chromic acid, sulfuric acid or boric acid, an organic acid such as oxalic acid, sulfamic acid, or a salt of such acid, alone or in combination, and most preferably in an aqueous solution of phosphoric acid, sulfuric acid or a combination thereof. Electro-deposition of a silicate, as described in U.S. Pat. No. 3,658,662, may also be an effective treatment for an aluminum plate. An aluminum plate is also suitable which have been subjected to an electrolysis with alternating current in an electrolyte containing hydrochloric acid, followed by an anodization treatment in an electrolyte containing sulfuric acid. It is also preferable to apply a precoating, comprising a cellulose-based resin and a water-soluble salt of a metal such as zinc, onto the anodized aluminum plate, for preventing the formation of the scum during a press operation.

Examples of presensitized plates comprising such support having provided thereon a silver halide light-sensitive layer include one from which a lithographic printing plate is to be prepared by a silver halide diffusion transfer method as described in "Insatsu-Zasshi (Printing Journal)" Vol. 61, No. 6, pages 3-6 (1978), wherein the presensitized plate is image-wise exposed to the laser beam, followed by a chemical development (silver salt dissolving type) as employed in a conventional silver salt diffusion-transfer method to form a silver image in the surface, which image is then rendered to be lipophilic; one from which a lithographic printing plate is to be prepared by tanning development as described in U.S. Pat. No. 3,146,104 or Japanese Patent Application (OPI) No. 10422/77, in which the development in carried out with a specific type of developer so that gelatin is crosslinked and cured by the oxidation product formed when the silver halide contained in the light-sensitive layer has been reduced to produce silver image, resulting in lipophilic image areas of the cured gelatin and hydrophilic non-image areas of the uncured gelatin; and one comprising a support having provided thereon a non-silver light-sensitive layer capable of forming a lipophilic image and a silver halide light-sensitive layer in this order.

However, the most preferred embodiment of the present invention is the last one, i.e. a presensitized plate from which a printing plate for lithography is to be prepared, and comprising a support having provided thereon a non-silver light-sensitive layer capable of forming a lipophilic image and a silver halide light-sensitive layer, which will be explained more in detail.

Non-silver light-sensitive layers provided on the support capable of forming a lipophilic image include light-sensitive, layers which are suitably used in conventional presensitized plates.

The term "lipophilic" in lipophilic image means that the image repels the dampening water but receives oily ink in press operation. Examples of compositions for the non-silver light-sensitive layer include a composition containing a diazo resin; a composition containing an O-quinonediazide compound; a composition containing a light-sensitive azide compound; a photopolymerizable composition containing an addition-polymerizable unsaturated compound, a photopolymerization initiator and a polymer linder; and a composition containing a polymer having a group of

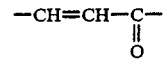

in the main or side chain thereof, of which the composition containing an O-quinonediazide compound is particularly preferred. The details of these compositions are found in U.S. Pat. No. 4,268,609. Such non-silver light-sensitive layer is generally provided to form a coating in an amount of 0.1 to 5 g/m² after drying.

A silver halide light-sensitive layer is then disposed on the non-silver light-sensitive layer thus obtained, to form a composite presensitized plate (PS) plate), from which a printing plate is automatically prepared with an autodeveloper as described in U.S. Pat. Nos. 4,299,912 or 4,141,733, as follows: The PS plate is imagewise exposed to light to form a latent image in the silver halide, which is then developed (first development) immediately followed by treatment with a fixing solution. Thereafter the plate is exposed to actinic radiation including ultraviolet radiation and then subjected to a second development stage, where the non-image areas are dissolved away and the highly light-sensitive silver halide layer is removed to recover substantially all the silver, thereby obtaining a printing plate in which a lipophilic image is formed on the hydrophilic surface of the support. The second development is conducted with a developing solution as used in developing conventional PS plates. For example, in a case where the non-silver light-sensitive layer comprises an O-quinonediazide compound, an aqueous solution of silicate of an alkali metal as described in U.S. Pat. No. 4,259,434 is used, while an aqueous solution as described in British Patent No. 2069164A is used for the first development.

As described in the foregoing, according to the present invention, there is provided a presensitized plate for lithography, comprising a silver halide light-sensitive layer, which is specifically high in sensitivity to an argon-ion laser but relatively low to a light having the other wavelength, and therefore which can be handled under the lighter safe light.

The present invention is now described with reference to the following examples, which are given only for illustrative purposes.

The percentage indicates percent by weight unless otherwise noted.

EXAMPLE 1

An aluminum plate (2S) having a thickness of 0.15 mm, which has been mechanically grained according to the method as disclosed in Japanese Patent Application (OPI) No. 33911/73, was immersed in a 2% aqueous solution of sodium hydroxide held at 40° C., for one minute to etch part of the surface of the plate. Following washing with water, the plate was immersed in a sulfuric acid/chromic acid solution for about one minute to expose the surface of pure aluminum. The resultant plate was then subjected to an anodization treatment for two minutes in 20% sulfuric acid under the conditions of 1.5 V of direct current voltage and 3A/dm$^2$ of current density, followed by washing with water and drying.

A light-sensitive solution of the following composition was continuously coated on the anodized aluminum plate using a roll-coater, in an amount of about 2 g/m$^2$ after drying:

| | |
|---|---|
| Naphthoquinone-1,2-diazide(2)-5-sulfuric acid ester of acetone-pyrogallol resin (prepared by the method of Example 1 of U.S. Pat. No. 3,635,709) | 2.5 g |
| Cresol-formaldehyde resin | 5.0 g |
| Methylethyl ketone | 75 g |
| Cyclohexane | 60 g |

Then, a light-sensitive emulsion of the following composition was continuously coated thereon in an amount of about 4.0 g/m$^2$ (after drying) and then dried with hot air at a final temperature of 110° C. Emulsion:

| | |
|---|---|
| Resin emulsion* | 870 g |
| Negative working silver halide emulsion** | 1000 g |

*This emulsion has been prepared by mixing a solution of 45 g of phenol-formaldehyde resin MP120HH (produced by Gunei Kakagu Co., Japan) in 330 g of ethylacetate and 120 g of methylethyl ketone with a solution obtained by dissolving 60 ml of 10% sodium novylbenzene sulfonate solution and 150 ml of 10% Turkey-redoil methanol solution in 600 ml of 10% aqueous gelatin solution.
**Silver chlorobromide comprising 30 mol % of silver bromide, having average grain size of 0.2μ, is used. The emulsion contains 55 g of gelatin and 0.85 moles of the silver halide per kg.

To the emulsion, there was added a sensitizing dye as shown in Table I to prepare emulsion, A, B and C and comparative emulsions a and b.

TABLE I

| Sample No. | Sensitizing dye added | Amount of addition |
|---|---|---|
| A | 0.2% solution of Compound 2 in methanol | 220 ml |
| B | 0.4% solution of Compound 8 in methanol | 220 ml |
| C | 0.4% solution of Compound 17 in methanol | 220 ml |
| a | Sodium salt of 1,3-diethyl-5-[2-{3-(3-sulfopropyl) benzoxazole-2-ylidene} ethylidene] thiohydantoin | 200 ml |
| b | No sensitizing dye | — |

To each of the emulsions, there were added the following solutions and then each of the plate samples were coated with each of the resulting solutions so that a substantially equal amount of silver halide was present in each of the plate samples (about 1.8 g/m$^2$).

| | |
|---|---|
| 0.5% aqueous alkali solution of 4-hydroxy-6-methyl-1,3,3a,7-tetrazaindene | 1000 ml |
| 2% aqueous solution of 2,4-dichloro-6-hydroxy-S-triazine | 35 ml |

The plate samples were allowed to stand at room temperature for a week. Each plate sample was then wound around the exposing-drum of a color scanner, under the yellow light from a fluorescent lamp (40 watt) wrapped with optical filter SC 56 (produced by Fuji Photo Film Co. Ltd., Japan), and imagewise exposed, through a color-slide as original, for the four-color separations where the dot-line number was 175 lines-/inch. The color scanner used in the color-separation exposure was Chromagraph DC300ER (produced by Doctor.Engineering.Ludorf.Hell Company) equipped with argon-ion laser beam source (wavelength: 488 nm) as exposing light.

Each of the exposed samples then underwent the following processing by an automatic developing machine: Each sample was passed through a developer (I) of the formulation as shown below for 20 seconds at 32° C. and through a fixing solution (I) of the formulation given below for 10 seconds at room temperature. Then, each sample was passed through an ultraviolet exposure section, over a period of 15 seconds, in which there are provided three reflector mercury lamps. The sample was transferred to a washing section where it is rubbed with a brush while being immersed in hot water at 40° to 45° C. Each of the plate samples was then passed between squeeze rollers and through a developer (II) of the formulation shown below for 30 seconds at 30° C. Finally, there was applied, to each sample, a desensitizing gum solution, FP (produced by Fuji Photo Film Co. Ltd., Japan) with a gum coater 800G (produced by Fuji Photo Film Co. Ltd.) to prepare a printing plate for lithography.

| Formulation of Developer (I): | |
|---|---|
| Water | 700 ml |
| Metol: p-(methylamino)phenol sulfate (produced by Agfa) | 3.0 g |
| Sodium sulfite | 45.0 g |
| Hydroquinone | 12.0 g |
| Sodium carbonate (monohydrate) | 80.0 g |
| Potassium bromide | 2.0 g |
| Water to make | 1 liter |

This starting solution was diluted with water (1:2) for use as the developer.

| Formulation of Developer (II): | |
|---|---|
| Sodium silicate, JIS No. 1 | 100 g |
| Sodium metasilicate | 50 g |
| Pure water | 1,800 ml |
| Formulation of Fixing Solution (I): | |
| Water | 700 ml |
| Ammonium thiosulfate | 224 g |
| Sodium sulfite | 20 g |
| Water to make | 1,000 ml |

The relative exposure value for obtaining an appropriate image by an actinometer equipped in the color scanner, DC300ER. The results are shown in Table II.

TABLE II

| Starting Plate Sample | Relative Exposure value | Results |
|---|---|---|
| A | 750 | Excellent dot images including shadows and highlights were formed. |
| B | 750 | |
| C | 600 | |
| a | 1000 | No image was formed. |
| b | 1000 | |

Using the printing plates prepared from the respective plate samples, lithographic printing was carried out with a printing machine, C18 (a machine for dual-side four-color offset printing, produced by Komori Co., Japan).

Thus, with each of the printing plates prepared from plate samples A, B and C according to the present invention, there is obtained 100,000 four-color impressions in which the original image was excellently reproduced including highlights and shadows. By contrast, the printing plates prepared from the plate samples a and b could not reproduce any image, even when the exposure was made with the light of much higher intensity, i.e. even under 1000 units (the relative exposure value).

What is claimed is:

1. A presensitized plate for preparing a lithographic printing plate, comprising a flexible support having provided thereon at least one silver halide light-sensitive layer, said light-sensitive layer containing at least one sensitizing dye selected from the group consisting of the following compounds:

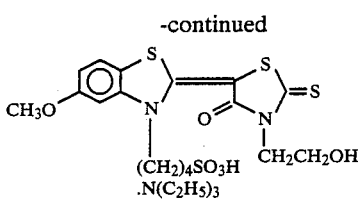
(1)

-continued

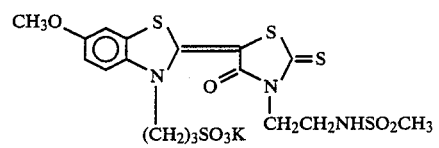
(2)

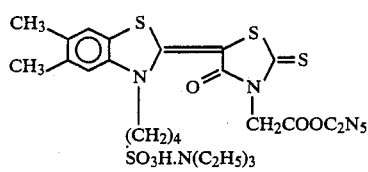
(3)

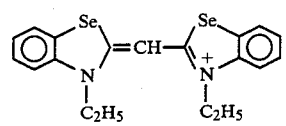
(4)

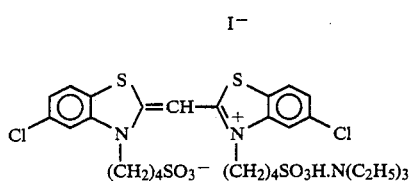
(7)

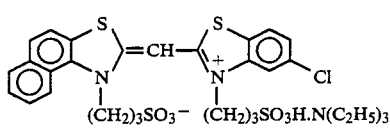
(8)

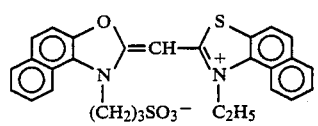
(9)

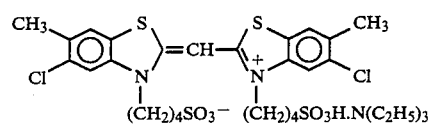
(10)

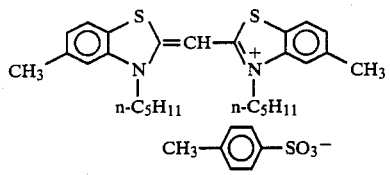
(11)

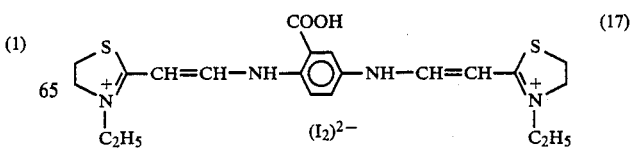
(12)

(17)

-continued

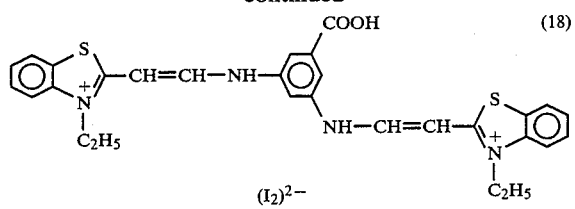

wherein said silver halide is chemically and spectrally sensitized so as to have the maximum spectral sensitivity at a wavelength in the range of 480 nm to 520 nm and is less sensitive to light having a wavelength longer than 540 nm.

2. The presensitized plate of claim 1 wherein said support is of an aluminum sheet.

3. A presensitized plate for preparing a lithographic printing plate, comprising a support having a hydrophilic surface and having provided thereon a non-silver light-sensitive layer capable of forming a lipophilic image and a silver halide light-sensitive layer in this order, said silver halide light-sensitive layer containing at least one sensitizing dye selected from the group consisting of the following compounds:

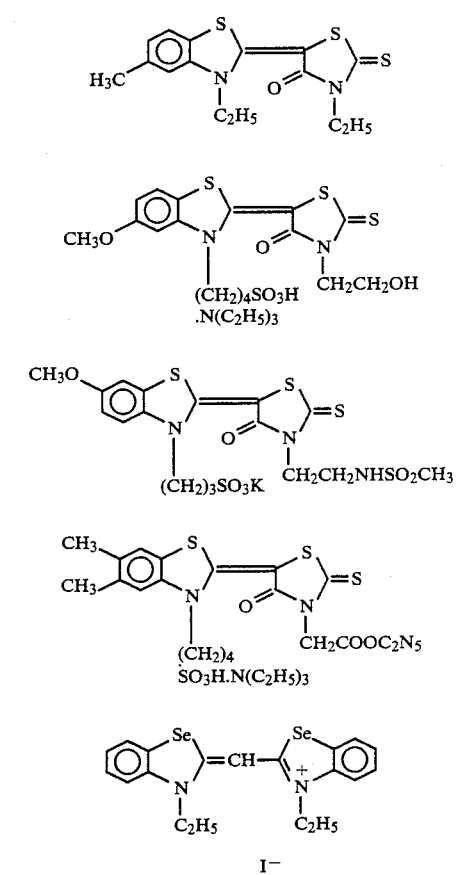

-continued

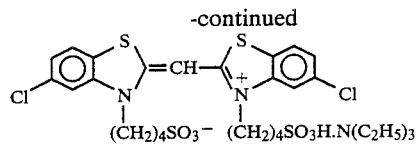

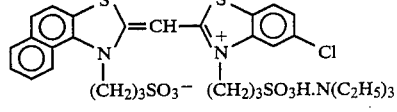

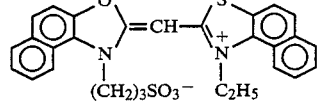

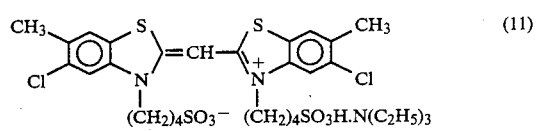

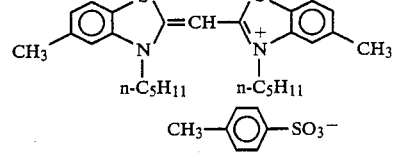

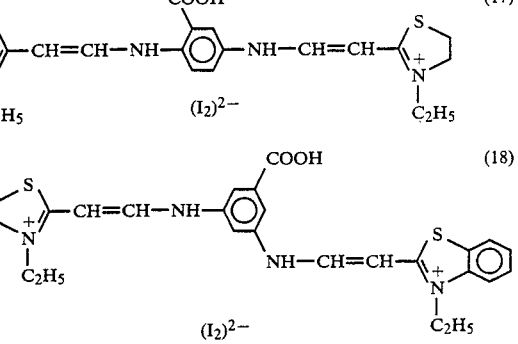

wherein said silver halide is chemically and spectrally sensitized so as to have the maximum spectral sensitivity at a wavelength in the range of 480 nm to 520 nm.

4. The presensitized plate of claim 3 wherein said support is of an aluminum sheet.

5. The presensitized plate of claim 3, said non-silver light-sensitive layer contains a light-sensitive composition comprising an O-quinonediazide compound.

6. The presensitized plate of claim 2, wherein said non-silver light-sensitive layer is coated on the support in an amount of 0.1 to 5 g/m² after drying.

7. A process for the production of a lithographic printing plate, which comprises the steps of:
(a) image-wise exposing to actinic light a presensitized plate as defined in claim 3,
(b) developing the plate exposed in the step (a),
(c) fixing the plate developed in the step (b),
(d) exposing the fixed plate to actinic light containing ultraviolet rays, and
(e) developing the plate exposed in the step (d).

* * * * *